TIME-BASE CIRCUIT EMPLOYING FOUR-LAYER SEMICONDUCTOR SWITCHING ELEMENT HAVING END LAYER DIVIDED INTO TWO SECTIONS

Filed June 30, 1964

INVENTOR.
BRIAN ERNEST ATTWOOD
BY
AGENT

United States Patent Office 3,286,105

Patented Nov. 15, 1966

3,286,105

TIME-BASE CIRCUIT EMPLOYING FOUR-LAYER SEMICONDUCTOR SWITCHING ELEMENT HAVING END LAYER DIVIDED INTO TWO SECTIONS

Brian Ernest Attwood, South Croydon, Surrey, England, assignor to North American Philips Company Inc., New York, N.Y., a corporation of Delaware Filed June 30, 1964, Ser. No. 379,260

Claims priority, application Great Britain, July 2, 1963, 26,184/63

16 Claims. (Cl. 307—88.5)

Figure 1:
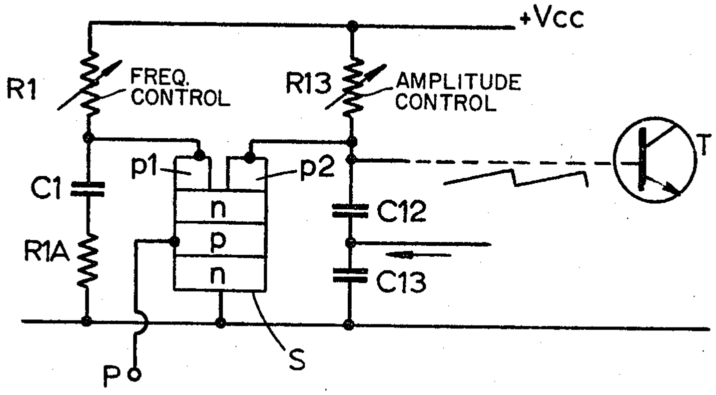

This invention relates to a relaxation oscillator utilizing a new four-layer semiconductor element. More particularly, the invention relates to a television magnetic beam deflection circuit which uses the relaxation oscillator to produce a sawtooth control signal for the transistor output stage of the deflection circuit.

Typical A.C.-coupled time-base circuits have the disadvantage that unless the external resistance of the base circuit of the output transistor is very low, the operating point of the transistor will shift due to variation in temperature (affecting the leakage current $Ico$) and $\alpha'$ spreads resulting from lack of uniformity in transistor manufacture.

In my copending U.S. application, Serial No. 233,670, filed October 29, 1962, now Patent No. 3,229,151 for a Field Time Base Circuit, I describe D.C.-coupled arrangements in which it is possible to effectively clamp the working point of the output transistor by a method that substantially does not attenuate the A.C. signal and yet saves components and reduces the effect of transistor and component spereads to negligible proportions.

The said field time-base circuit arrangements comprise, in combination, a transistor amplifier output stage, a charge network including a capacitor for supplying a sawtooth stroke drive to said transistor, an oscillator having a discharge circuit connected across said capacitor for periodically discharging the capacitor during flyback periods. The discharge circuit employs as its switching element a semi-conductor device. The time-base circuit further comprises a D.C. coupling from said charge network to the base of the output transistor which is adapted to transfer substantially unaltered any voltage level and voltage drive waveform set up by the charge network, a diode forming part of said discharge circuit and providing a D.C. connection from said oscillator circuit to said charge network during flyback, and means, including said discharge circuit and D.C. coupling, for clamping the base voltage of the output transistor at the beginning of each stroke to a residual voltage equal to the voltage drop occurring across said discharge circuit at the start of the stroke due to current that has passed through said discharge circuit at the end of the preceding flyback or to a voltage smaller than said residual voltage and of the same polarity or to one of opposite polarity.

The diode serves the important function of isolating the charge network from the discharge circuit of the oscillator. Thus it prevents or greatly reduces interaction between amplitude and frequency adjustments.

The residual voltage is equal to the sum of the small voltage drops occurring across said diode and across said semi-conductor switching device at the end of the flyback period. The base of the output transistor may be clamped to this residual voltage in which case said voltage will, even if it is relatively small, cause some wasted D.C. current to flow through the output transistor. However, compared with conventional A.C.-coupled circuits, the circuit still has certain advantages. Alternatively, the base may be clamped to a voltage smaller than the residual voltage and of the same polarity or to one of opposite polarity (which may be numerically smaller or greater). The clamping voltage may be obtained by injecting into the discharge circuit a backing-off voltage having a polarity opposite to that of the residual voltage. However, provision of a backing-off voltage will in general not be necessary when the output transistor is of the silicon type operating with a relatively high base-emitter voltage $Vbe$, for example, a $Vbe$ value of about 1 volt.

As explained in the aforesaid patent, the oscillator may employ a transistor with transformer coupling between its base and collector. As an alternative it may employ as its switching element a p-n-p-n junction device having the characteristic that it can be triggered into conduction (e.g. a silicon-controlled rectifier, referred to herein as an "SCR") in which case the transformer coupling is no longer needed. However, in this case the silicon controlled rectifier or other similar type semiconductor switching element is not self-oscillating and therefore synchronizing pulses are required to drive the circuit. This presents the problem that in the absence of synchronizing pulses, a deflection signal will not be produced and the electron beam will not be deflected. In the case of the frame deflection circuit, a single horizontal line is traced on the screen of the cathode ray tube. In time, the screen will be damaged necessitating an early replacement of the display tube.

The present invention provides an improvement in, or modification of, a circuit arrangement according to the latter alternative which utilizes a new four-layer semiconductor device having an end layer divided into two sections having separate terminals so as to provide two main current paths in the device. The new four-layer device can be connected to produce a relaxation oscillator which is free-running and does not require synchronizing pulses to operate it. In contrast with known relaxation oscillators, e.g. multivibrators and blocking oscillators, the new relaxation oscillator has the advantage that it is internally coupled within the new four-layer semiconductor device. A multivibrator requires external coupling components such as capacitors and resistors. A blocking oscillator requires an expensive blocking transformer to provide the coupling. A relaxation oscillator using an internally coupled four layer semiconductor device therefore requires fewer components.

It is therefore an object of the invention to provide a new and improved four-layer semi-conductor switching device.

Another object of the invention is to provide a new and improved relaxation oscillator which utilizes the improved four-layer switching device as the active element.

A further object of the invention is to provide a new and improved television deflection circuit which uses the new four-layer switching device to provide the sawtooth drive signal for the output stage of the deflection circuit.

A preferred embodiment of the invention provides a field time-base circuit arrangement comprising, in combination, a transistor amplifier output stage, a charge network including a capacitor for supplying a sawtooth stroke drive to said transistor, a four-layer semi-conductor switching element which is capable of being triggered into conduction and has an end (anode or cathode) layer split into two sections with separate terminals so as to provide two cathode-anode paths, a discharge circuit connected across said capacitor for periodically discharging the capacitor during flyback periods which discharge circuit includes one of said cathode-anode paths, an oscillator circuit employing the other of said cathode-anode paths with a further capacitor across said other path and means for charging said further capacitor to raise the voltage across said other path to the breakdown voltage of that path, a D.C. coupling from said charge network to the base of the output transistor which D.C.

coupling is adapted to transfer substantially unaltered any voltage level and voltage drive waveform set up by the charge network, means, including said discharge circuit and D.C. coupling, for clamping the base voltage of the output transistor at the beginning of each stroke to a given voltage level, and a control resistor between the oscillator cathode-anode path and the associated capacitor, the charge network and the capacitor of the oscillator being so arranged that, in operation, the capacitor of the oscillator reaches the breakdown voltage of its respective cathode-anode path before the capacitor of the charge network reaches the breakdown voltage of its associated cathode-anode path.

This last feature ensures that the charging of the capacitor of the oscillator determines the frequency of the sawtooth waveform produced under free-running conditions, while the charge network determines independently the amplitude of the sawtooth drive waveform, which in turn sets the raster height when applied to a conventional field scan.

The switching element may be of the SCR (silicon-controlled-rectifier) type with a well-defined holding current. It may have a split p-anode layer, in which case it must be used with an output transistor of n-p-n type. This is a preferred arrangement with the SCR devices presently available. Conversely, the switching element may have a split n-cathode layer in which case it must be used with an output transistor of p-n-p type. If there is an intermediate buffer or driver transistor it must be of the same conductivity type as the output transistor.

For television purposes some form of linearizing feedback must be provided from the output circuit to control the rate of charge of the capacitor of the charge network.

The nature of the residual voltage has been explained in the prior specification and, as before, the base of the output transistor may be clamped to said residual voltage. In the present case this is preferred to the provision of a backing-off voltage when using a silicon output transistor having a base-emitter ($V_{be}$) voltage of a relatively high value, e.g. about 1 volt.

The advantages gained over conventional A.C.-coupled circuits are similar to those described in the prior patent. As for the mode of operation, it differs as follows from that of a circuit according to the earlier patent using a conventional 4-layer switching element and a separate diode. The diode D1 of the older circuit has physical connections to external circuitry which controls conduction. In contrast, in the present case the junction of the corresponding end-layer section relies on the breakdown of the other path to cause conduction.

Figure 2:
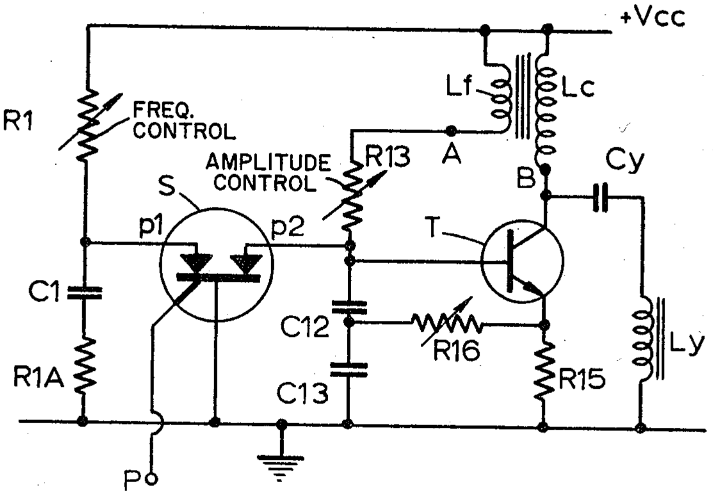
Figures 3, 4:
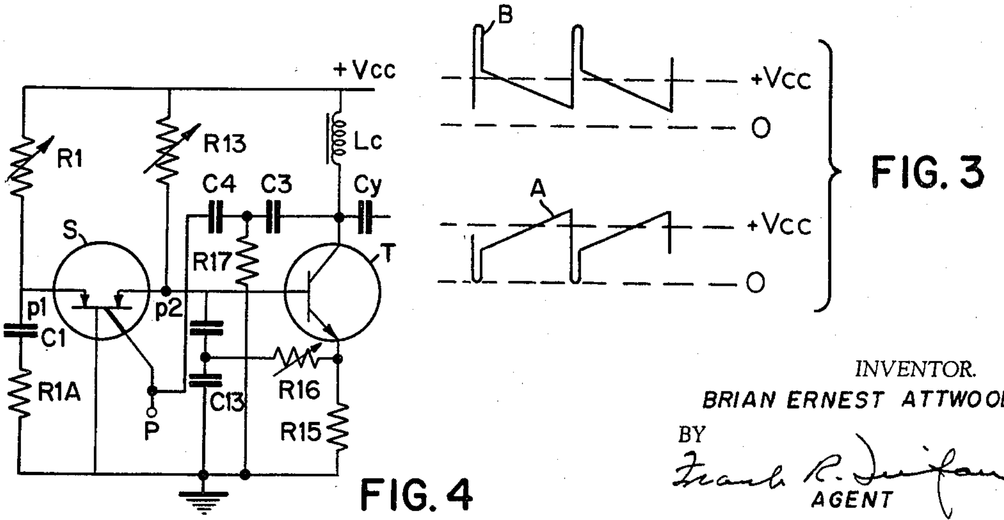

Specific embodiments of the invention suitable for television receivers will now be described by way of example with reference to the accompanying diagrammatic drawings in which:

FIG. 1 illustrates a relaxation oscillator in accordance with the invention wherein the output stage is shown schematically, FIG. 2 is a schematic diagram of a television field deflection circuit which utilizes an improved form of relaxation oscillator, FIG. 3 illustrates the waveforms occurring at points A and B of the circuit in FIG. 2, and FIG. 4 illustrates another embodiment of the invention.

The field time-base circuit arrangement of FIGURE 1 includes a transistor amplifier output stage T, a charge network including a resistor R13 and a capacitor C12–C13 for supplying a sawtooth stroke drive to said transistor, a four-layer semi-conductor switching element S which is capable of being triggered into conduction and has its anode layer split into two sections p1–p2 with separate anode terminals so as to provide two cathode-anode paths, a discharge circuit connected across said capacitor C12–C13 for periodically discharging the capacitor during flyback periods which discharge circuit includes one of said cathode-anode paths (n-p-n-p2), an oscillator circuit employing the other of said cathode-anode paths with a capacitor C1 across said path, a resistor R1 for charging C1, and D.C. coupling from said charge network to the base of the output transistor. The D.C. coupling must be such as to transfer substantially unaltered any voltage level and voltage drive waveform set up by the charge network, and it operates (with said discharge circuit) so as to clamp the base voltage of the output transistor T at the beginning of each stroke to a residual voltage equal to the voltage drop occurring across said discharge circuit at the start of the stroke. The D.C. coupling may include an emitter-follower buffer stage employing a transistor of the same conductivity type as ouput transistor T, but no such stage is used in the latter example where a direction connection is provided as the D.C. coupling.

If FIGURES 1 and 2 are compared with FIGURE 3 of the aforesaid patent, it will be seen that the same reference numerals have been used for corresponding elements wherever possible. It will also be seen that the original diode D1, transistor T1 and transformers $Lb1$–$Lb2$ are replaced by the p-n-p-n device S. Elements R1–C1 are still required and determine the frequency of operation, while R13, C12 and C13 are still required for amplitude control (the capacitor is split to permit the application of feedback from the output stage to improve linearity). A small control resistor R1A is added for controlling the rate of discharge of capacitor C1. For this purpose it can be connected anywhere between capacitor C1 and the path n-p-n-p1, but preferably not in the cathode (n) lead. The two best positions are as shown or in the p1 lead.

The principle of operation will now be described in more detail with reference to FIGURE 1. At the start of operation C1 charges up towards the voltage of the $V_{cc}$ rail via R1. When the voltage across capacitor C1 reaches the breakdown voltage of the device S, the path n-p-n-p1 conducts and bottoms. Capacitors C12–C13 also charge up towards the $V_{cc}$ rail and, when the switch S conducts, flyback occurs. To isolate the circuit of R1 from that of R13 it is necessary to ensure that path n-p-n-p1 breaks down first. This can be accomplished by causing the voltage to rise much faster across capacitor C1 than across capacitor C12–C13. In the present example this is achieved by making C12–C13 much larger than C1. Path n-p-n-p1 thus breaks down first but, as soon as this occurs, junction p2-n will conduct and C12–C13 will discharge via n-p-n-p2. The cycle recommences when the sum of the currents flowing via paths n-p-n-p1 and n-p-n-p2 has dropped below the holding current value of the switch S.

In order to prevent the height control R13 from influencing the sawtooth frequency by modifying said sum of currents in device S at the end of flyback, the current via path n-p-n-p2 is either reduced substantially to zero before the desired flyback period has elapsed after the inital breakdown (e.g. about 1 ms. thereafter for a television receiver) or is small as compared with the current through n-p-n-p1. This can easily be arranged as far as the discharge current from C12–C13 is concerned but it still leaves the path n-p-n-p2–R13 from the $V_{cc}$ rail. In a two-stage circuit (i.e. one having only oscillator and output stages) the value of R13 is such that the current flowing could be as high as 30 ma. which could affect the switch-off of the device S.

If, however, additional feedback is applied inductively from the collector circuit of T to correct for linearity (an extra feedback loop is usually required when the driver stage is omitted) then this problem is readily solved.

This will be understood more clearly by referring to FIGURES 2 and 3 which show a more refined field time-base circuit suitable for a television receiver and capable of providing 110° magnetic deflection in a cathode-ray tube operated with an EHT of 18 kv. The device S is shown by an alternative symbol. As will be seen, linearity feedback to C12–C13 is applied from the emitter of transistor T via a resistor R16, and the additional feedback is applied to R13 by a winding L*f* coupled to a choke L*c* in the collector circuit of transistor T. Deflection coils L*y* are connected to the collector of transistor T via a blocking capacitor C*y*. FIGURE 3 shows schematically the waveforms appearing at points A and B of this circuit.

Reverting to the problem stated before the preceding paragraph, it will be seen from FIGURE 3 that the voltage at point A can automatically be made to fall substantially to zero (or even slightly negative) during flyback since the votage waveform at point A has the form shown. There is considerable latitude in the choice of the turns ratio of L*c*-L*f* in the output circuit. Therefore, if there is no voltage across R13 at the end of the flyback period, there will be no current flow via R13. The time at which flyback ends will thus be entirely dependent on R1–C1–R1A.

The circuit of FIGURE 2 is free-running but it can be synchronized by means of field synchronization pulses applied from terminal P to the gate terminal of the device S.

The circuit shown in FIGURE 2 has a very simple oscillator and provides good performance since it avoids interdependence of controls. One set of practical values and components suitable for use in a field time-base of a television receiver is given below by way of example:

*Table*

H.T. Voltage (V*cc*)=30 v.
Device S=Experimental switch of SCR type having:
  Holding current =30–40 ma.;
  Breakdown voltage (V*bo*)=25 v.;
  Peak current rating=about 2 amps.
Transistor T=U.S. silicon type 2N1486
Resistor R1=15 K.
Resistor R1A=82 ohms
Resistor R13=2 K.
Resistor R16=50 ohms
Resistor R15=6.8 ohms
Capacitor C1=6.4 μf.
Capacitor C12=100 μf.
Capacitor C13=100 μf.
Capacitor C*y*=1000 μf.
Winding L*c*=945 turns
  28 s.w.g.
  18 ohms
  900 mh.
Winding L*f*=700 turns
  39 s.w.g.

As shown in FIGURE 2, the correct polarity switch for use with an n-p-n output transistor is a device with a split p anode layer and the gate on the inner p layer. For a p-n-p output transistor the switch device would be required to have a split n cathode layer and the gate on the inner p layer.

The manufacture of the switch device can be carried out in a simple manner. In a typical example the final layer is made by controlled diffusion of a material of opposite conductivity, areas not requiring penetration being suitably masked. Since a mask is thus used in the existing process (e.g. to form an annular layer), it is easy to modify the mask so that it confines the diffusion to two separate p or n areas (e.g. two half-annuli).

As an alternative to the modified SCR-type switch described above, the circuit may employ a modified SCR gate turn-off switch. Such switches are designed to be capable of being turned off by a signal applied to the gate, and a suitable example is the U.S. type ZJ224HU or G6U. The modification required is, again, the splitting of the anode layer into two sections.

The circuit of FIG. 4 illustrates how the circuit of FIG. 2 can be changed to use the modified SCR gate turn-off switch described above. First, L*f* is removed and R13 connected directly to the top rail. In lieu of E*f*, the collector of transistor T is coupled to the terminal P through two series connected capacitors C3 and C4. The junction of the two capacitors is connected to ground via a resistor R17. The first capacitor, C3 (the one nearest to T) and the resistor R17 form a differentiating circuit having a time constant such that the interval between the leading edge of a positive pulse and that of a subsequent negative pulse lies between 0.5 ms. and 1 ms. (assuming a nominal field flyback of 1.4 ms. according to the British 405-line system). The first pulse is of such sign that it has no effect on the switch S since it merely attempts to make the switch conduct more heavily. The second differentiation pulse is of such sign as to turn switch S off if it has not been turned off already by the effect of its current falling below the holding current level.

Although the invention has been described with reference to certain preferred embodiments thereof, it will be obvious that many modifications may be made therein without departing from the spirit and scope of the invention, as defined in the appended claims.

What is claimed is:

1. A circuit for producing a deflection current in an inductance comprising, a semiconductor output amplifier coupled to said inductance and having a control electrode for controlling current flow therein, a charge network including a first capacitor for deriving a sawtooth drive signal having a stroke period and a flyback period, a four-layer semiconductor switching element of the type which can be triggered into conduction and having an end layer divided into two individual sections each having a separate terminal, said four layer element further comprising a third terminal connected to a separate layer thereof thereby to form a first current path in said four-layer element with a first one of said two sections and a second current path therein with the second one of said two sections, each of said current paths having a predetermined value of breakdown voltage for initiating current flow therein, a discharge circuit for said first capacitor comprising means for coupling said first capacitor across the terminals which define said first current path, a direct current connection between said charge network and said semiconductor amplifier control electrode for transferring thereto, substantially unaltered, the voltage level and sawtooth drive signal derived in said charge network, and means for periodically applying a voltage of said predetermined breakdown value across the terminals which define said second current path thereby to initiate said flyback period by the discharge of said first capacitor through said first current path.

2. A circuit as described in claim 1 wherein said voltage applying means comprises a second capacitor connected across said second current path and means for charging said second capacitor to raise the voltage across said second current path to said predetermined breakdown voltage, the charging time constant of said second capacitor being lower than the charging time constant for said first capacitor.

3. A circuit as described in claim 2 further comprising a resistor and means for connecting said resistor, said second capacitor and said second current path in a series circuit.

4. A circuit as described in claim 1 wherein said third terminal is connected to a layer of said four-layer element which is separated from said end layer by at least one intermediate semiconductive layer.

5. A circuit as described in claim 3 wherein said first capacitor comprises two individual capacitors connected in series to form a junction point therebetween and said semiconductor output amplifier comprises a transistor having an emitter, a second resistor connected between said emitter and a point of reference potential, and a feedback path interconnecting said second resistor and said junction point for supplying a linearizing feedback signal to said first capacitor.

6. A circuit as described in claim 2 wherein said switching element comprises a silicon controlled rectifier having a P-type end layer divided into two individual sections and wherein said semiconductor output amplifier comprises a silicon transistor of the n-p-n type.

7. A circuit for producing a deflection current waveform having a long gradually varying stroke portion and a flyback portion in which a high amplitude pulse of short duration is produced, comprising a semiconductor output amplifier having a control electrode and an output circuit, a source of voltage, a charge network comprising, a first capacitor, an impedance element, and means connecting said first capacitor and said impedance element in series across said voltage source so as to derive a sawtooth drive voltage across said capacitor, a four layer semiconductor switch-type element having an end layer divided into two separate sections each of which has a terminal, said four-layer element further comprising a third terminal connected to a layer thereof separated from said end layer by at least one intermediate semiconductor layer thereby to form a first current path in said four layer element with a first one of said two sections and a second current path therein with the second one of said two sections, each of said current paths having a given value of breakdown voltage for initiating current flow therein, means connecting said first capacitor across the terminals which define said first current path for periodically discharging said capacitor during the flyback portion, means providing a direct current connection for coupling said sawtooth drive voltage from said first capacitor to said output amplifier control electrode whereby said deflection current waveform is produced in said output circuit in response thereto, and means for applying a varying voltage across the terminals which define said second current path so as to raise the voltage thereof to said given breakdown value thereby to initiate current flow in said second and said first current paths.

8. A circuit as described in claim 7 further comprising means for coupling a portion of the flyback pulse developed in said output circuit to said charge network in a sense to oppose the current flow produced by said voltage source.

9. A circuit as described in claim 8 wherein said pulse coupling means comprises a transformer having a primary winding connected in said output circuit and an inductively coupled secondary winding serially connected in said charge network.

10. A circuit as described in claim 9 wherein said voltage applying means comprises, a second capacitor connected across said second current path, impedance means, and means connecting said second capacitor and said impedance means in series across said voltage source.

11. A circuit as described in claim 10 further comprising a resistor and means for connecting said resistor, said second capacitor and said second current path in a closed loop series circuit.

12. A circuit for producing a deflection current having a stroke period and a flyback period in an inductance comprising, an output transistor having an emitter and collector which define a current path and a base electrode for controlling the current flow in said path, a four layer semiconductor element having one end layer divided into two separate sections each of which has a terminal and a second end layer having a third terminal connected thereto thereby to form a first current path in said four-layer element with a first one of said two sections and a second current path therein with the second one of said two sections, each of said current paths having a given value of breakdown voltage for initiating current flow therein, a source of voltage, a first variable resistor, a first capacitor, a transformer having first and second inductively coupled windings, means connecting said first winding in series circuit with said transistor emitter-collector current path, means for applying a voltage to said series circuit, means connecting said second winding, said first variable resistor and said first capacitor in series across said voltage source, means connecting said first capacitor across the terminals which define said four layer element first current path to provide a discharge path for said first capacitor during the flyback period, a second variable resistor, a second capacitor, a third resistor, means connecting said second variable resistor, said second capacitor and said third resistor in series across said voltage source thereby to charge said second capacitor, means connecting said second capacitor and said third resistor in series across the terminals which define said four layer element second current path thereby to provide a discharge path for said second capacitor when the voltage thereon reaches said given breakdown voltage of said second current path, means providing a direct current connection between said first capacitor and said output transistor base electrode, and means coupling said inductance to the collector of said output transistor.

13. A relaxation oscillator comprising, a four layer semiconductor element having one end layer divided into two separate sections each of which has a terminal and a second layer separated from said end layer by at least one semiconductive layer and having a third terminal connected thereto thereby to form a first current path in said four layer element with a first one of said two sections and a second current path therein with the second one of said two sections, each of said current paths having a given value of breakdown voltage for initiating current flow therein, a first capacitor, means connecting said first capacitor across the terminals which define said four layer element first current path to provide a discharge path for said first capacitor, means for charging said first capacitor towards said first current path breakdown voltage, a second capacitor connected across the terminals which define said second current path, and means for charging said second capacitor so as to raise the voltage across said second current path to said given breakdown voltage before the voltage across said first capacitor reaches the breakdown valtage of said first current path.

14. A circuit as described in claim 13 wherein the charging time constant of said second capacitor is shorter than the charging time constant of said first capacitor.

15. A circuit as described in claim 13 further comprising a resistor and means for connecting said resistor, said second capacitor and said second current path in a series circuit.

16. A circuit for producing a deflection current having a stroke period and a flyback period in an inductance comprising, an output transistor having an emitter and collector which define a current path and a base electrode for controlling the current flow in said path, a four layer semiconductor element having one end layer divided into two separate sections each of which has a terminal and a second end layer having a third terminal connected thereto thereby to form a first current path in said four-layer element with a first one of said two sections and a second current path therein with the second one of said two sections, each of said current paths having a given value of breakdown voltage for initiating current flow therein, a gate terminal connected to an intermediate control layer of said four layer element, a source of voltage, a first variable resistor, a first capacitor, means connecting said first variable resistor and said first capacitor in series across said voltage source, means connecting said first capacitor across the terminals which define said four layer element first current path to provide a discharge path for said first capacitor during the flyback period, a second variable resistor, a second capacitor, a third resistor, means connecting said second variable resistor, said second capacitor and said third resistor in series across said voltage source thereby to charge said second capacitor, means connecting said second capacitor and said third resistor in series across the terminals which define said four layer element second current path thereby to provide a discharge path for said second capacitor when the voltage thereon reaches said given breakdown voltage of said second current path, means providing a direct current connection between said first capacitor and said output transistor base electrode, means for coupling the collector of said output transistor to said gate terminal for supplying thereto a voltage pulse of a polarity to turn-off the current flow in said four layer element, and means coupling said inductance to the collector of said output transistor.

References Cited by the Examiner

UNITED STATES PATENTS

| | | | |
|---|---|---|---|
| 3,196,330 | 7/1965 | Moyson | 317—235 |
| 3,201,596 | 8/1965 | Longini | 307—88.5 |

ARTHUR GAUSS, *Primary Examiner.*

J. ZAZWORSKY, *Assistant Examiner.*

UNITED STATES PATENT OFFICE
CERTIFICATE OF CORRECTION

Patent No. 3,286,105 November 15, 1966

Brian Ernest Attwood

It is hereby certified that error appears in the above numbered patent requiring correction and that the said Letters Patent should read as corrected below.

Column 6, line 3, for "Ef" read -- Lf --.

Signed and sealed this 12th day of September 1967.

(SEAL)
Attest:

ERNEST W. SWIDER
Attesting Officer

EDWARD J. BRENNER
Commissioner of Patents